United States Patent
Kim

(10) Patent No.: US 7,656,715 B2
(45) Date of Patent: Feb. 2, 2010

(54) SEMICONDUCTOR MEMORY DEVICE

(75) Inventor: Kwang-Hyun Kim, Kyoungki-do (KR)

(73) Assignee: Hynix Semiconductor, Inc, Gyeonggi-do (KR)

(*) Notice: Subject to any disclaimer, the term of this patent is extended or adjusted under 35 U.S.C. 154(b) by 101 days.

(21) Appl. No.: 11/819,822

(22) Filed: Jun. 29, 2007

(65) Prior Publication Data

US 2008/0159050 A1     Jul. 3, 2008

(30) Foreign Application Priority Data

Dec. 27, 2006  (KR) ................. 10-2006-0134301

(51) Int. Cl.
*G11C 7/10*  (2006.01)
*G11C 7/02*  (2006.01)

(52) U.S. Cl. .................. 365/189.02; 365/189.05; 365/207

(58) Field of Classification Search ........... 365/189.02, 365/189.05, 207
See application file for complete search history.

(56) References Cited

U.S. PATENT DOCUMENTS

| | | | | |
|---|---|---|---|---|
| 5,995,430 A | * | 11/1999 | Yabe | ............... 365/203 |
| 6,020,776 A | | 2/2000 | Young | |
| 6,219,746 B1 | * | 4/2001 | Vogley | ............... 711/104 |
| 6,816,416 B2 | | 11/2004 | Won | |
| 6,987,705 B2 | | 1/2006 | Kim et al. | |
| 7,043,672 B2 | | 5/2006 | Merritt | |
| 2004/0240268 A1 | * | 12/2004 | Kim et al. | ............... 365/185.09 |
| 2004/0243961 A1 | | 12/2004 | Iadonato et al. | |
| 2005/0146919 A1 | * | 7/2005 | Ellis et al. | ............... 365/149 |

FOREIGN PATENT DOCUMENTS

| | | | |
|---|---|---|---|
| JP | 2004-246958 | | 9/2004 |
| JP | 2005-038526 | | 2/2005 |
| KR | 2001091238 A | * | 10/2001 |
| KR | 10-0436065 B1 | | 6/2004 |
| KR | 10-2005-0087014 A | | 8/2005 |

* cited by examiner

*Primary Examiner*—Ly D Pham
(74) *Attorney, Agent, or Firm*—IP & T Law Firm PLC

(57) ABSTRACT

A semiconductor memory device includes data transmission devices for transmit data in synchronization with each other. The semiconductor memory device includes a plurality of data transferring unit, a first control unit, a multiplexing unit, and a second control unit. The plurality of data transferring unit transfers data to a plurality of global lines. The first control unit controls the plurality of data transferring unit in response to a column select signal to select a column of a memory cell. The multiplexing unit multiplexes the data transferred to the plurality of global lines. The second control unit controls the multiplexing unit, wherein the second control unit synchronizes the column select signal with a column address signal having a column address information of the memory cell.

9 Claims, 8 Drawing Sheets

SEMICONDUCTOR MEMORY DEVICE

CROSS-REFERENCE TO RELATED APPLICATIONS

The present invention claims priority of Korean patent application no. 10-2006-0134301, filed in Korean Patent Office on Dec. 27, 2006, which is incorporated by reference in its entirety.

BACKGROUND OF THE INVENTION

The present invention relates to a semiconductor design technology; and, more particularly, to an apparatus for transmitting read data from the semiconductor memory device.

A DRAM (dynamic random access memory), which is a representative semiconductor memory device, provides ×4, ×8 and ×16 action modes. These action modes output data using four or eight I/O pins at the same time or output the data using sixteen I/O pins at the same time. Generally, the DRAM has a circuit which is designed based on the ×16 action mode and one of ×4, ×8 and ×16 action mode is selectively applied to the data transmission.

That the data are read out through the ×8 action mode in the DRAM which is designed based on the ×16 action mode is to selectively use eight lines among 16 I/O lines.

In order to achieve this operation in the DRAM, two line groups are required in the data transmission path, for example, first and second global I/O line groups. Also, it is necessary to have a multiplexing unit for selecting transferred data from these two global I/O line groups. Further, to control the multiplexing unit, it is necessary to have an additional column address signal which is an address signal together with a read command.

FIG. 1 is a block diagram illustrating a conventional read transmission path in a semiconductor memory device.

Referring to FIG. 1, in the read transmission path, there are two local I/O lines LIO0 and LIO1, two sense amplifiers 11A and 11B for sensing and amplifying data LIOD0 and LIOD1 which are applied to the two local I/O lines LIO0 and LIO1, two global I/O lines GIO0 and GIO1, a multiplexing unit 12 for selecting one from the data GIOD0 and GIOD1 transferred from the two global I/O lines GIO0 and GIO1 and a latch unit 13 for transferring the latched data DQD to an output terminal DQ. Further, a first control unit 14 to control two sense amplifiers 11A and 11B and a latch unit 13 is provided as well as a second control unit 15 to control the multiplexing unit 12.

Even though two local I/O lines LIO0 and LIO1 and two sense amplifiers 11A and 11B are illustrated, a plurality of local I/O lines and sense amplifiers can be provided. That is, the local I/O lines and the sense amplifiers corresponding to the local I/O lines are limited to two in numbers for the sake of convenience.

Meanwhile, the data processing in the read operation will be illustrated below.

When the read command is inputted to the DRAM, the data LIOD0 and LIOD1 stored in the memory cell are applied to the sense amplifiers 11A and 11B through the local I/O lines LIO0 and LIO1.

A control signal IOSTBP0 or IOSTBP1 for the individual sense amplifier 11A or 11B is produced in response to a column select signal YI produced based on a burst action, which is a signal to select a column in the memory cell and corresponds to a write command, and the data LIOD0 and LIOD1 on the I/O lines LIO0 and LIO1 are applied to the global I/O line GIO0 or GIO1 in response to the control signal IOSTBP0 or IOSTBP1.

Subsequently, the data GIOD0 and GIOD1 of the global I/O lines GIO0 and GIO1 reach to the multiplexing unit 12 and one of these data GIOD0 and GIOD1 is selected in response to a multiplexing control signal GY9 which is produced in response to the column address signal Y9 which is a signal having a column address information of the memory cell and corresponds to the read command. The selected data SELD is transferred to the latch unit 13.

The selected data SELD which is transferred to the latch unit 13 is transferred to the output terminal DQ in response to a latch control signal PINSTB which is generated in response to the column select signal YI.

FIG. 2 is a timing chart illustrating an operation of a circuit existing on the read transmission path of FIG. 1. Assuming that burst length is 2 and the read command is inputted four times, the column address signal Y9 undergoes a level transition in response to the input of each of the read commands READ1 to READ4 and the column select signal YI starts the toggling in the level transition based on the write command which is inputted together with the read commands READ1 to READ4.

When the column address signal Y9 is a logic low level, the data GIOD0 is loaded to the first global I/O line GIO0. When the column address signal Y9 is a logic high level, the data GIOD1 is loaded to the second global I/O line GIO1. This operation is controlled by the control signals IOSPBP0 and IOSTBP1 of the sense amplifiers 11A and 11B.

In FIG. 2, the dotted line in the waveform of data GIOD0 and GIOD1 loaded to the global I/O lines GIOO and GIO1 represents the latch operation of the previous value as a meaningless level.

Next, the multiplexing unit 12 selects one from the data GIOD0 and GIOD1, which are loaded to the two global I/O lines GIOO and GIO1, in response to the multiplexing control signal GY9 and transfers the selected data to the latch unit 13. The latch unit 13 transfers the data to the output terminal DQ in response to the latch control signal PINSTB.

On the other hand, a point of time data stored in the memory cell is read out is determined by the column select signal YI. Therefore, the timing of the column select signal YI frequently changes in order to meet the data read timing. As a result, the timing of the control signals IOSTBP0, IOSTBP1 and PINSTB, which are generated in response to the column select signal YI, may also change.

That is, both the transmission timing of the data LIODO and LIOD1, which are delivered to the global I/O lines GIO0 and GIO1 from the local I/O lines LIO0 and LIO1, and the transmission timing of the data DQD from the latch unit 13 may change. However, in the situation where the transmission timing of data is changed by the sense amplifier 11 and latch unit 13, there are some problems because the transmission timing of the multiplexing unit 12 which is located in the center of the transmission does not change.

That is, since the first control unit 14, which uses the column select signal YI as a source signal, and the second control unit 15, which uses the column address signal Y9 as a source signal, are unable to work mutually, the devices (reference numerals 11 to 13) do not work in synchronization with each other.

FIG. 3 illustrates this problem of the read transmission path.

Referring to FIG. 3, in order to meet the read timing of the data, the read data GIOD0' and GIOD1' are loaded to the global I/O lines GIO0 and GIO1 with a delay time according to a delayed column select signal YI' in an activation time. Subsequently, the data GIOD0' and GIOD1' are selected in response to the multiplex control signal GY9. At this time, there is a difference (A) in waveform between the selected data SED' and the data GIOD0' and GIOD1', which are transferred to the global I/O lines GIO0 and GIO1, wherein the dotted line represents the latch operation of the previous value as a meaningless level. The waveform difference between the two data GIOD0' and GIOD1' is caused by the difference in synchronization between the operations of the sense amplifier 11 and the multiplexing unit 12.

The data SELD' outputted from the multiplexing unit 12 are delivered to the output terminal DQ in response to the latch control signal PINSTB'. At this time, since the latch control signal PINSTB' uses the column select signal YI as a source signal, the data SELD' are delivered to the output terminal DQ with a predetermined delay time. Therefore, there is a difference (B) in waveform between the data SED' from the multiplexing unit 12 and the data DQD' from the latch unit 13. The reason why the waveform difference is caused is that the multiplexing unit 12 and the latch unit 13 are not synchronized with each other. Here, the difference of the waveform, as mentioned above, means a difference in timing of a rising edge and a falling edge.

The problems motioned above are as follows: first, the synchronization of the multiplexing unit 12 and the sense amplifier 11 does not match with each other and second, the synchronization of the latch unit 13 and the multiplexing-unit 12 does not match with each other. These problems are caused based on that the source signals Y1 and Y9 of the control units 14 and 15, which respectively control the sense amplifier 11, the multiplexing unit 12 and the latch unit 13, are different from each other.

SUMMARY OF THE INVENTION

Embodiments of the present invention are directed to providing a semiconductor memory device capable of matching a synchronization between data transmission apparatus.

Additionally, embodiments of the present invention are directed to providing a semiconductor memory device capable of matching a synchronization between a sense amplifier which senses and amplifies data from local I/O lines to global I/O lines and a multiplexing unit which multiplexes the data on the global I/O lines and transfers the data to a latch unit (pipe latch circuit). Further, an embodiment of the present invention is directed to providing a semiconductor memory device capable of matching a synchronization between a multiplexing unit and a latch unit.

In accordance with an aspect of the present invention, a semiconductor memory device includes a plurality of data transferring unit for transferring data to a plurality of global lines, a first control unit for controlling the plurality of data transferring unit in response to a column select signal to select a column of a memory cell, a multiplexing unit for multiplexing the data transferred to the plurality of global lines, and a second control unit for controlling the multiplexing unit, wherein the second control unit synchronizes the column select signal with a column address signal having a column address information of the memory cell.

In accordance with another aspect of the present invention, a semiconductor memory device includes I/O lines for transferring data, a select unit for selecting one of data on a first and a second data I/O lines in response to a control signal, and a control signal generating unit for outputting the control signal using a column select signal and a column address signal.

DESCRIPTION OF SPECIFIC EMBODIMENTS

The problems described above are caused by the synchronization mismatch between the data transferring apparatus. Accordingly, the present invention provides an apparatus for producing a control signal which cooperates with a column select signal having a large amount of fluctuations. That is, a control signal for a data transmission apparatus synchronizes with the column select signal Y1 so that data are transferred in response to the control signal in synchronization with the column select signal.

Hereinafter, a semiconductor memory device in accordance with the present invention will be described in detail referring to the accompanying drawings.

Figure 1:
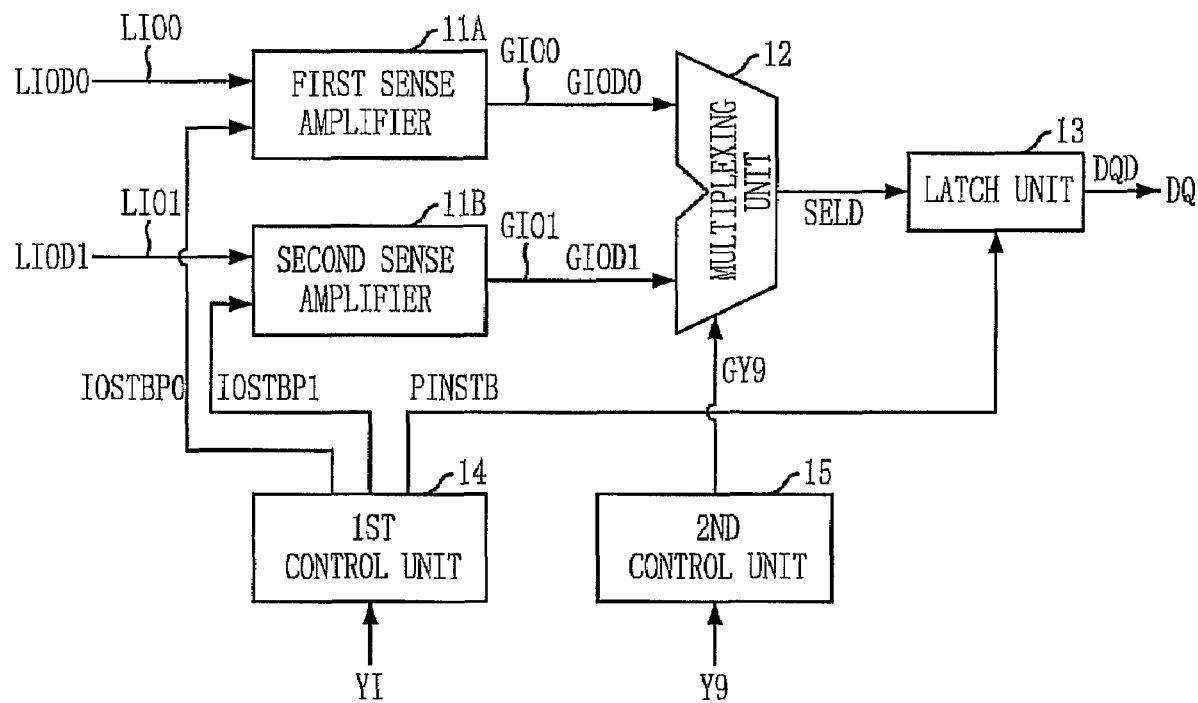
FIG. 1 is a block diagram illustrating a conventional read transmission path in a semiconductor memory device.
Figure 2:
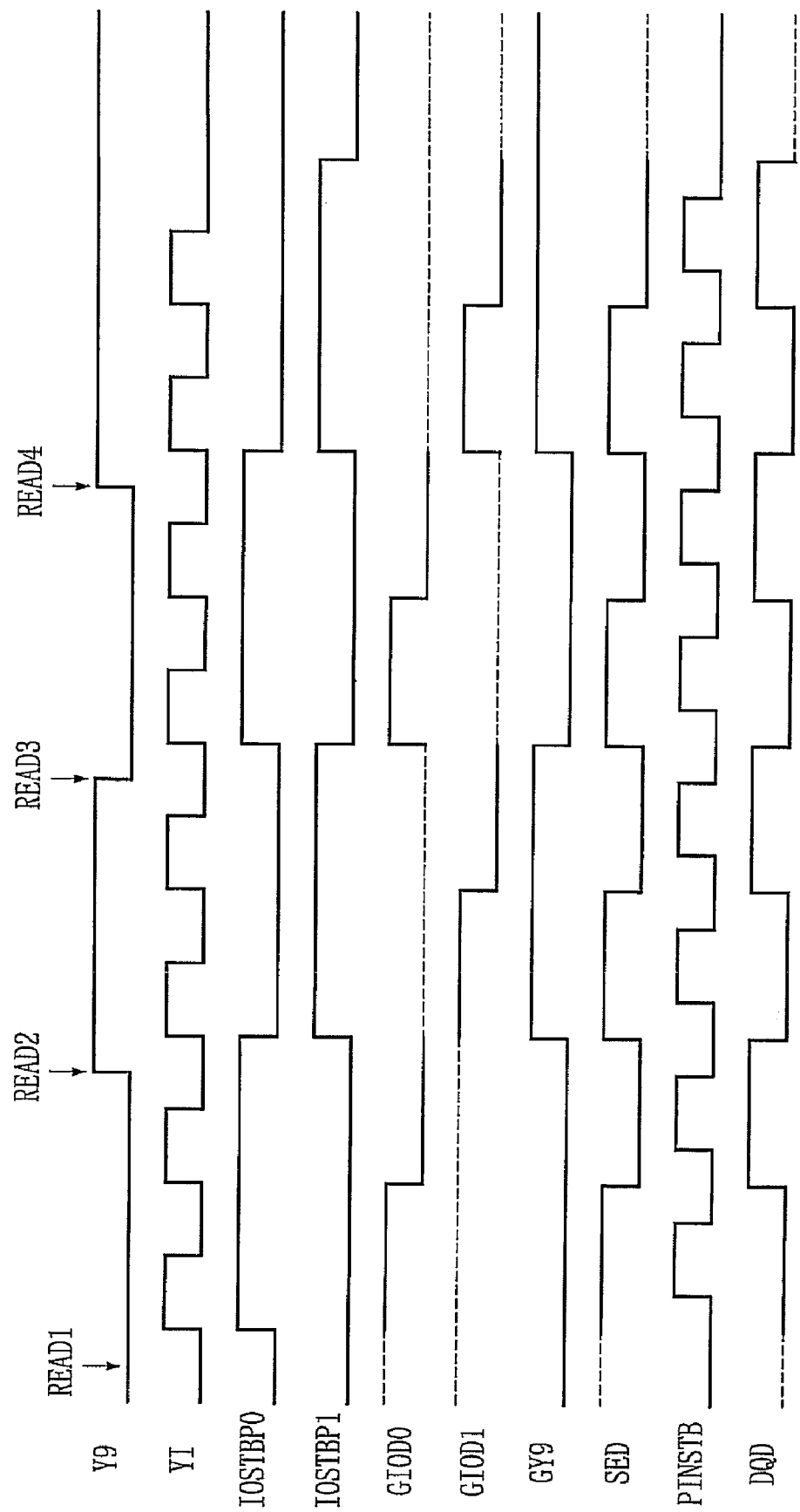
FIG. 2 is a timing chart illustrating an operation of a circuit existing on the read transmission path of FIG. 1.
Figure 3:
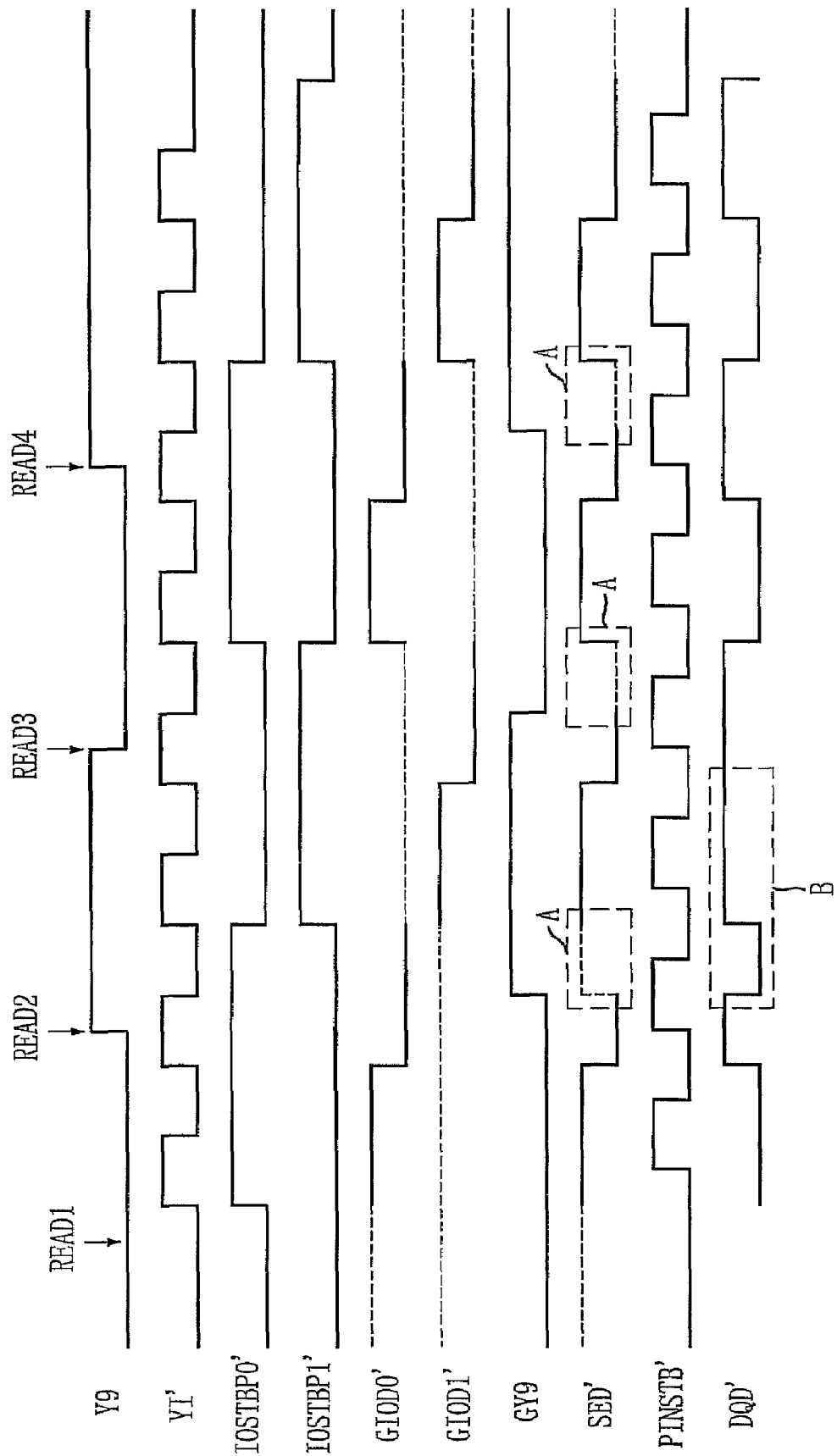
FIG. 3 is a timing chart illustrating a problem of the read transmission path of FIG. 1.
Figure 4:
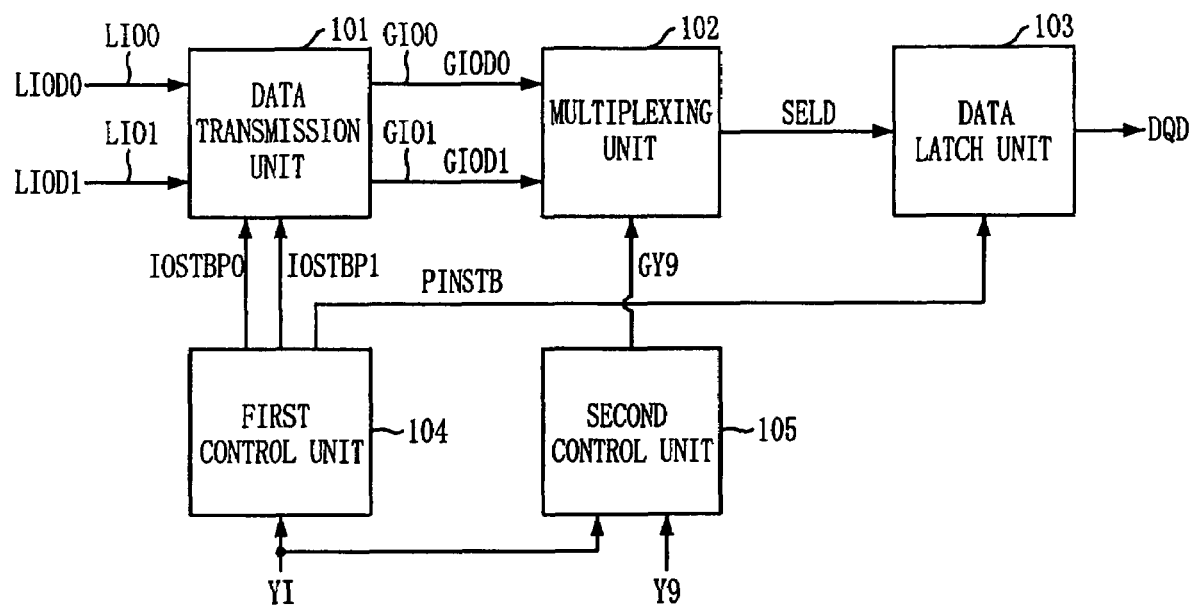
FIG. 4 is a block diagram illustrating a read transmission path in one embodiment of the present invention.

FIG. 4 is a block diagram illustrating a read transmission path in one embodiment of the present invention. Referring to FIG. 4, a read transmission path according to one embodiment of the present invention includes: a data transmission unit 101 which transfers applied data LIOD0 and LIOD1 to a plurality of lines GIO0 and GIO1 which are denoted as a first global I/O line group GIO0 and a second global I/O line group GIO1 for the sake of convenience; a first control unit 104 to receive a column select signal Y1 to select a column of a memory cell and to transfer it to data transmission unit 101; a multiplexing unit 102 to multiplex the data GIOD0 and GIOD1 which are applied to the plurality of the lines GIO0 and GIO1; a second control unit 105 to control the multiplexing unit 102 by synchronizing the column address signal Y9 having column address information of the memory cell with the column select signal Y1; and a data latch unit 103 to output multiplexed data SELD in response to a data output signal PINSTB which is produced in correspondence with the column select signal YI.

Figure 5:
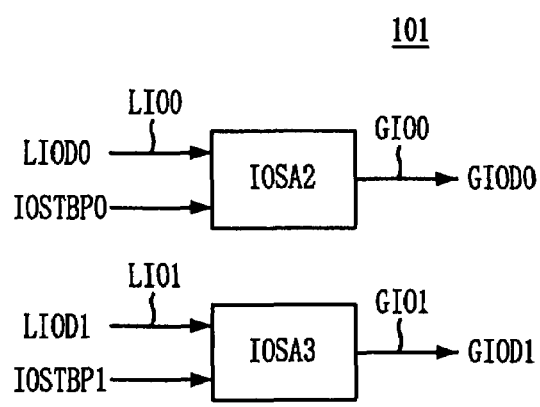
FIG. 5 is a block diagram illustrating a data transmission unit of FIG. 4.

Each element will be described more concretely. FIG. 5 is a block diagram illustrating a data transmission unit of FIG. 4 and the same reference numerals denote the same elements in FIGS. 4 and 5. Referring to FIG. 5, the data transmission unit 101 has sense amplifiers IOSA2 and IOSA3 which corresponds to the plurality of the local I/O lines LIO0 and LIO1.

Figure 6:
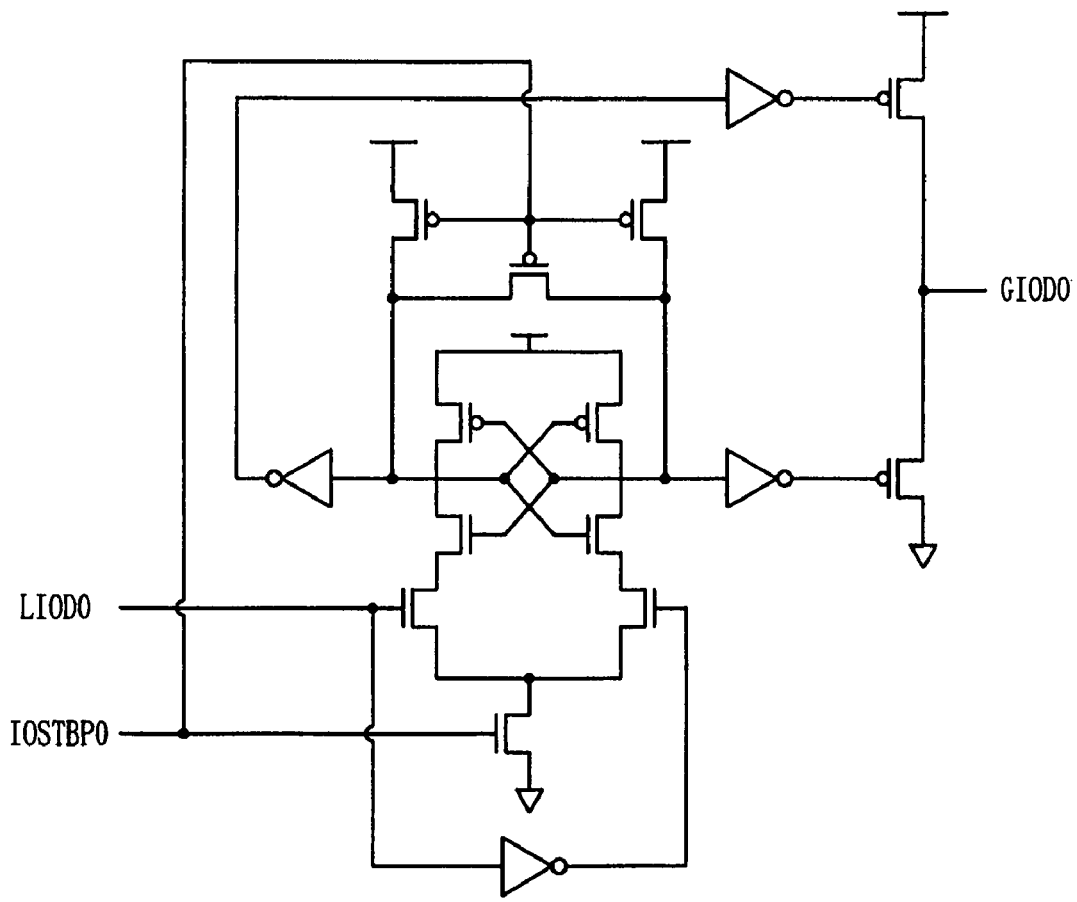
FIG. 6 is a circuit diagram illustrating a sense amplifier of FIG. 5.

These sense amplifiers IOSA2 and IOSA3 are controlled by sense amplifier control signals IOSTBP0 and IOSTBP1 from the first control unit 104. The sense amplifiers IOSA2 and IOSA3 sense the data from the plurality of local I/O lines LIO0 and LIO1 and transfer the sense data to the global I/O line groups GIO0 and GIO1. For example, the sense amplifier IOSA2 can be designed as shown in FIG. 6; however, since this sense amplifier is well-known to those skilled in the art to which the subject pertains, the detailed description will be omitted in the present invention.

Figure 7:
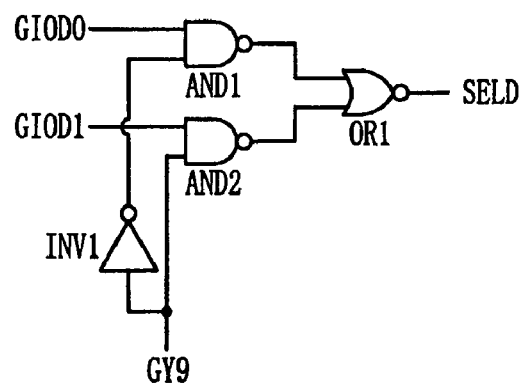
FIG. 7 is a circuit diagram illustrating a multiplexing unit of FIG. 4.

FIG. 7 is a circuit diagram illustrating the multiplexing unit of FIG. 4. Referring to FIG. 7, the multiplexing unit 102 selects one from the data GIOD0 and GIOD1, which are transferred from two divided global I/O line groups GIO0 and GIO1, in response to a multiplexing control signal GY9, thereby outputting selected data SELD.

Therefore, the multiplexing unit 102 includes a first AND gate AND1 to receive an output data GIOD0 of the first global I/O line group GIO0 and an inverted multiplexing control signal GY9 from an inverter INV1, a second AND gate AND2 to receive an output data GIOD1 of the second global I/O line group GIO1 and the multiplexing control signal GY9, and an OR gate OR1 for OR operation on output signals of the first and second AND gates AND1 and AND2.

Figure 8:
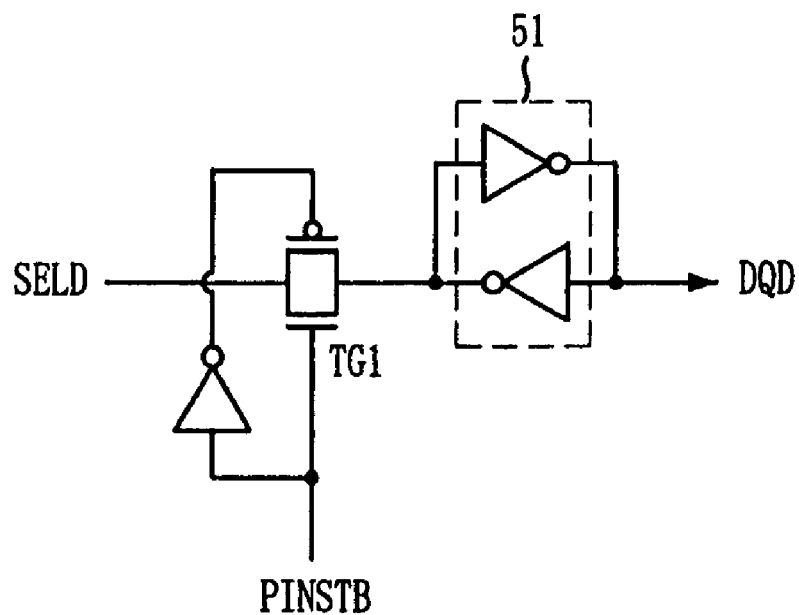
FIG. 8 is a circuit diagram illustrating a data latch unit of FIG. 4.

FIG. 8 is a circuit diagram illustrating a data latch unit of FIG. 4. Referring to FIG. 8, the data latch unit 103 latches the output data SELD of the multiplexing unit 102 in response to the latch control signal PINSTB. In order to achieve the above-mentioned operation, the data latch unit 103 includes a transfer gate TG1 to transfer the output data SELD of the multiplexing unit 102 in response to the latch control signal PINSTB and a latch circuit 51 to latch an output signal of the transfer gate TG1.

Figure 9:
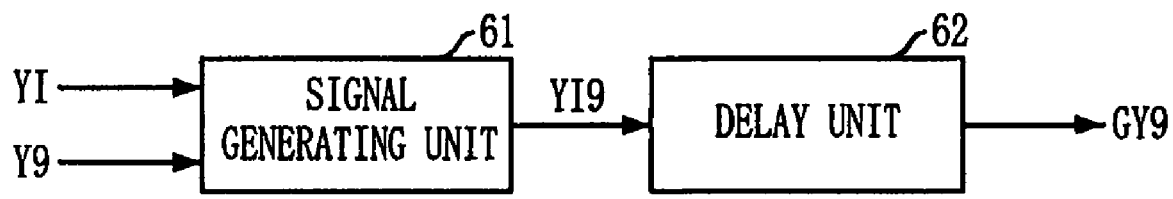
FIG. 9 is a block diagram illustrating a second control unit of FIG. 4.

FIG. 9 is a block diagram illustrating the second control unit 105 of FIG. 4. Referring to FIG. 9, the second control unit 105 includes a signal generating unit 61 to receive the column select signal YI and the column address signal Y9 and a delay unit 62 to asynchronously delay an output signal of the signal generating unit 61 and then outputs the multiplexing control signal GY9.

Here, the signal generating unit 61 is used as an apparatus for synchronizing the column address signal Y9 with the column select signal YI. As a result, a multiplexing control source signal Y19 is produced by synchronizing the column address signal Y9 with the column select signal YI.

Figure 10:
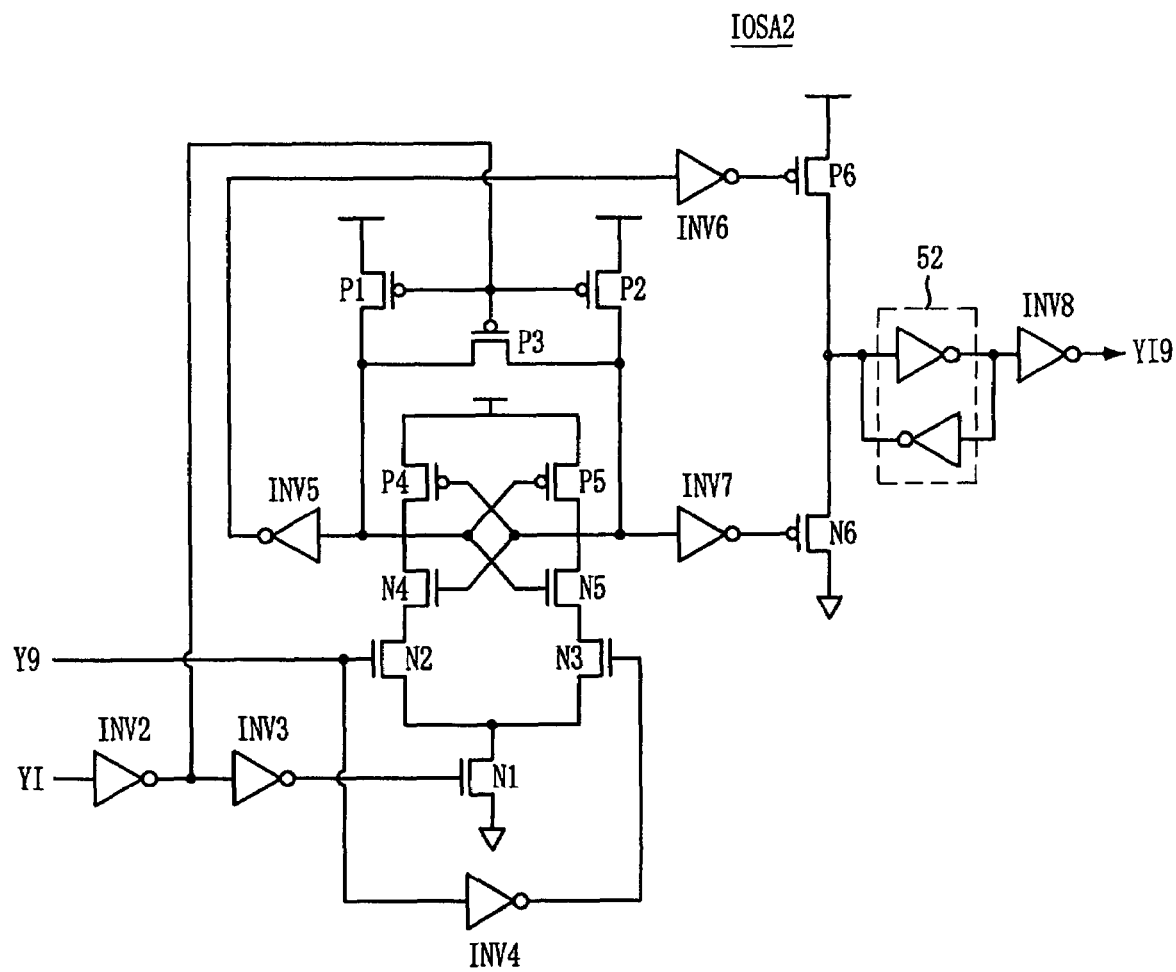
FIG. 10 is a block diagram and a timing chart illustrating a signal generating unit of FIG. 9.

FIG. 10 is a block diagram and a timing chart illustrating the signal generating unit of FIG. 9. Referring to FIG. 10, the signal generating unit 61, as an edge detector, includes a plurality of inverters INV2 to INV8, a plurality of PMOS transistors P1 to P6, a plurality of NMOS transistors N1 to N6 and a latch circuit 52.

The signal generating unit 61 works when the enable transistors N1 and P1 to P3 of which gates essentially receive the column select signal Y1 are turned on and the logic level of the multiplexing control source signal Y19 is, with this operation time, determined based on the logic level of the column address signal Y9. When the signal generating unit 61 does not work, the logic level of the multiplexing control source signal Yl9 is fixed by the latch circuit 52.

At this time, since the enabling of the signal generating unit 61 is achieved by the column select signal YI, a rising or falling edge of the multiplexing control source signal Yl9 is determined by the column select signal YI. In another embodiment of the signal generating unit 61, a transfer gate to transfer the column address signal Y9 using the column select signal Yl as a control signal and a latch circuit to latch an output of the transfer gate can implement the signal generating unit.

Figure 11:
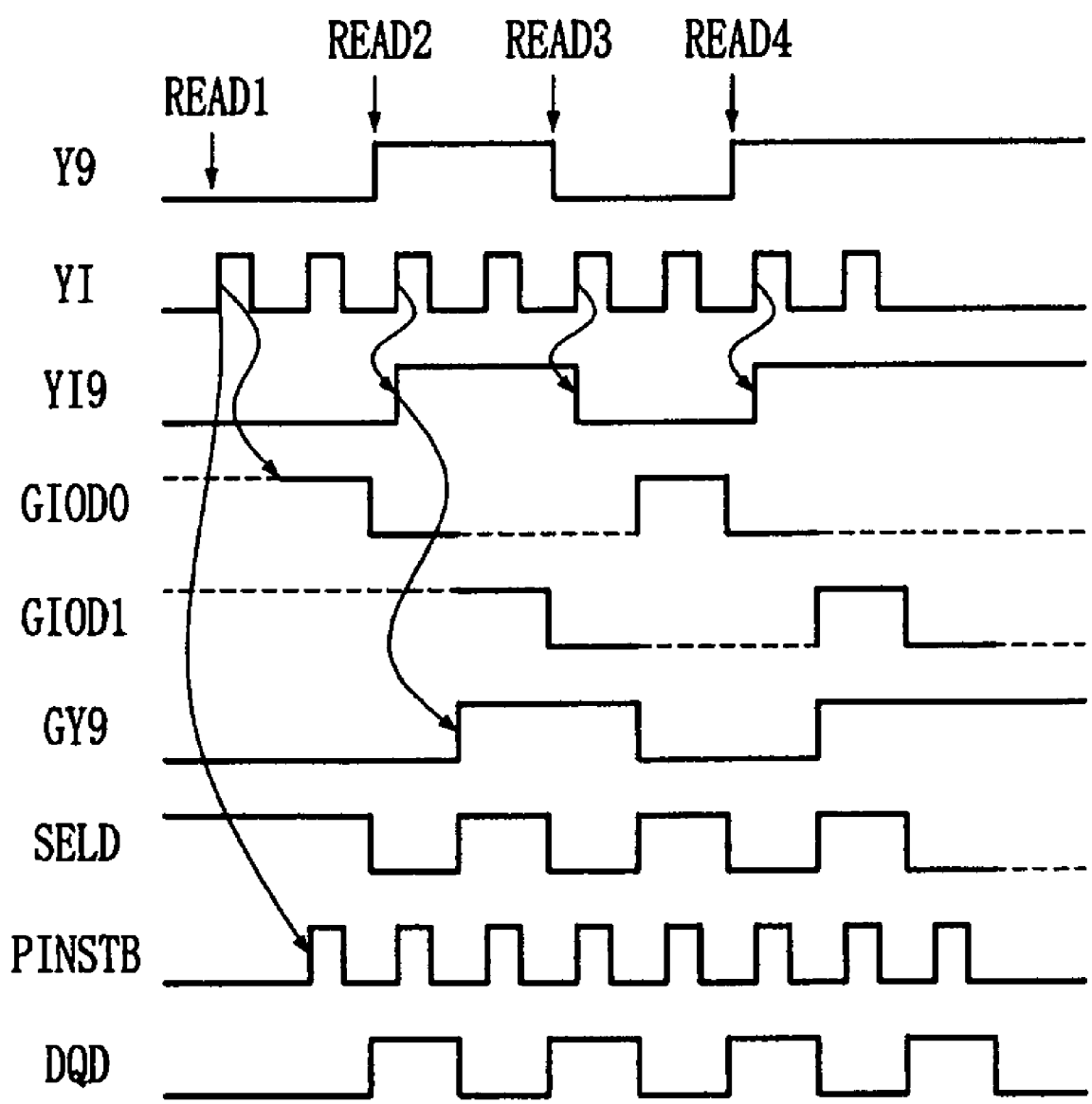
FIG. 11 is a timing chart illustrating output signals of the circuits existing on the read transmission path of FIG. 4.

FIG. 11 is a timing chart illustrating output signals of the circuits existing on the read transmission path of FIG. 4. Referring to FIG. 11, the column address signal Y9 undergoes a level transition in response to the input of each of the read commands READ1 to READ4 and the column select signal YI starts the toggling in the level transition based on the write command which is inputted together with the read commands READ1 to READ4.

When the column address signal Y9 is a logic low level, the data GIOD0 is loaded to the first global I/O line GIO0. When the column address signal Y9 is a logic high level, the data GIOD1 is loaded to the second global I/O line GIO1. At this time, the dotted line in the waveform of data GIOD0 and GIOD1 loaded to the global I/O lines GIOO and GIO1 means the latch operation of the previous value as a meaningless level.

Next, one of the data GIOD0 and GIOD1, which are loaded to the two global I/O line groups GIOO and GIO1, is selected in response to the multiplexing control signal GY9 and the selected data is transferred to the latch unit 103. The multiplexing control signal GY9 is a signal which is generated by the column address signal Y9 that is synchronized with the column select signal Yl. Accordingly, the multiplexing control signal GY9 fluctuates with the fluctuation of the column select signal Yl so that one of the data GIOD0 and GIOD1 on the global I/O line groups GIO0 and GIO1 is correctly selected.

Next, in the data latch unit 103, the data DQD is transferred to the output terminal to DQ in response to the latch control signal PINSTB. In similar to the above-mentioned operation, since the latch control signal PINSTB, which is generated by the column select signal YI, and the multiplex control signal GY9 mutually work, the data DQD of data latch 103 is correctly transferred to the output terminal DQ.

In the data transmission, selection and latch operations between the apparatus, for example, the data transmission unit 101, the multiplexing unit 102 and the data latch unit 103 according to the present invention, the control signals for the apparatus synchronize with the column select signal Yl.

Accordingly, being different from the conventional multiplexer using only the column address signal Y9 as a control source signal, the present invention uses both the column address signal Y9 and the column select signal Yl. At this time, since the control signal of the multiplexing unit 102 mutually works with the column select signal Yl, the data transmission between the data transmission unit 101, the multiplexing unit 102 and the data latch unit 103 does not cause an error.

As apparent from the above, the present invention obtains a timing margin without distortion of data transmission and secures the stability and reliability of the semiconductor memory device.

While the present invention has been described with respect to the particular embodiments, it will be apparent to those skilled in the art that various changes and modifications may be made without departing from the spirit and scope of the invention as defined in the following claims. For example, the embodiment of the present invention is illustrated based on the high active signal in the logic circuits and an arrangement of the logic circuits. Moreover, the signal generating unit can be modified by various logic circuits, which is well-known to those skilled in the art to which the subject pertains.

What is claimed is:

1. A semiconductor memory device comprising:
a plurality of data transferring unit for transferring data to a plurality of global lines;
a first control unit for controlling the plurality of data transferring unit in response to a column select signal to select a column of memory cells;

a multiplexing unit for multiplexing the data transferred to the plurality of global lines; and a second control unit for controlling the multiplexing unit, wherein the second control unit synchronizes the column select signal with a column address signal having a column address information of the memory cell and includes a signal generating unit for generating a control signal for the multiplexing unit by using the column select signal and the column address signal.

2. The semiconductor memory device of claim 1, further comprising a data latch unit for latching the multiplexed data in response to a data latch control signal which is produced based on the column select signal.

3. The semiconductor memory device of claim 1, wherein the second control unit further includes a delay unit for delaying the control signal which is outputted from the signal generating unit.

4. The semiconductor memory device of claim 1, wherein the signal generating unit includes an edge detector which outputs the control signal by synchronizing the column address signal with the column select signal.

5. The semiconductor memory device of claim 2, wherein the data latch unit includes a transfer gate for transferring the multiplexed data in response to the data latch control signal and a latch circuit for latching an output signal of the transfer gate.

6. The semiconductor memory device of claim 1, wherein the data transferring unit includes a sense amplifier for sensing and amplifying the data.

7. A semiconductor memory device comprising:
a plurality of data transferring unit configured to sense and amplify data from memory cells to a plurality of global lines;

a first control unit for controlling the plurality of data transferring unit in response to a column select signal to select a column of the memory cells;

a multiplexing unit for multiplexing the data transferred to the plurality of global lines according to data action modes; and a second control unit for controlling the multiplexing unit by synchronizing the column select signal with a column address signal, wherein the column address signal has column address information of the memory cells and corresponds to the data action modes.

8. The semiconductor memory device of claim 7, wherein the second control unit includes a signal generating unit for generating a control signal for the multiplexing unit by synchronizing the column select signal with the column address signal.

9. The semiconductor memory device of claim 8, wherein the signal generating unit includes an edge detector for synchronizing the column address signal with the column select signal.

* * * * *